United States Patent [19]
Schreiber et al.

[11] Patent Number: 5,790,377
[45] Date of Patent: Aug. 4, 1998

[54] INTEGRAL COPPER COLUMN WITH SOLDER BUMP FLIP CHIP

[75] Inventors: Chris M. Schreiber, Lake Elsinore; Bao Le, Santa Ana, both of Calif.

[73] Assignee: Packard Hughes Interconnect Company, Irvine, Calif.

[21] Appl. No.: 713,084

[22] Filed: Sep. 12, 1996

[51] Int. Cl.$^6$ ........................................... H05K 7/20
[52] U.S. Cl. ...................... 361/704; 361/760; 361/749; 361/767; 361/774; 257/737; 257/738; 257/747; 257/778
[58] Field of Search ........................... 257/737, 738, 257/746, 747, 778, 780; 439/66, 68; 438/108, 613; 228/180.21, 180.22; 174/254, 260, 261; 361/749, 760, 767, 772, 774, 776, 783

[56] References Cited

U.S. PATENT DOCUMENTS

| | | | |
|---|---|---|---|
| 4,597,177 | 7/1986 | Baldauf et al. | 29/878 |
| 5,207,887 | 5/1993 | Crumly et al. | 205/78 |
| 5,346,857 | 9/1994 | Scharr et al. | 437/183 |
| 5,431,328 | 7/1995 | Chang et al. | 228/180.22 |
| 5,477,087 | 12/1995 | Kawakita et al. | 257/737 |
| 5,642,261 | 6/1997 | Bond et al. | 361/704 |

OTHER PUBLICATIONS

Clearfield et al. "A Single Top Surface Metallurgy for Solder Flip Chip, Wirebond and TAB Interconnections" ISHM '94 Proceedings, pp. 485–490.

Kloeser et al. "Cost Effective Flip–Chip Interconnections on FR–4 Boards", ISHM '94 Proceedings, pp. 491–500.

Goldmann, "Geometric Optimization of Controlled Collapse Interconnections", Geometric Optimization of Interconnections, May 1969, pp. 251–265.

Guo et al. "Effect of Composition on the Low–Cycle Fatigue of Pb Alloy Solder Joints," Alpha Metals Inc. Catalog (1985) p. 5—IEEE #0569 5503/9010000–0496; pp. 496–504.

*Primary Examiner*—Leo P. Picard
*Assistant Examiner*—Boris L. Chervinsky
*Attorney, Agent, or Firm*—Cary W. Brooks

[57] ABSTRACT

The present invention includes an integral copper column with a solder bump flip chip. An integrated circuit chip is provided having an electrical circuit and including at least two contact pads. A thin layer of barrier metallization is provided over the contact pads. A support substrate is provided having a circuit layer with raised features that include copper traces. A solder bump connects the contact pad on the integrated circuit chip and the raised features of the flex circuit to provide an integral copper column with a solder bump flip chip.

7 Claims, 1 Drawing Sheet

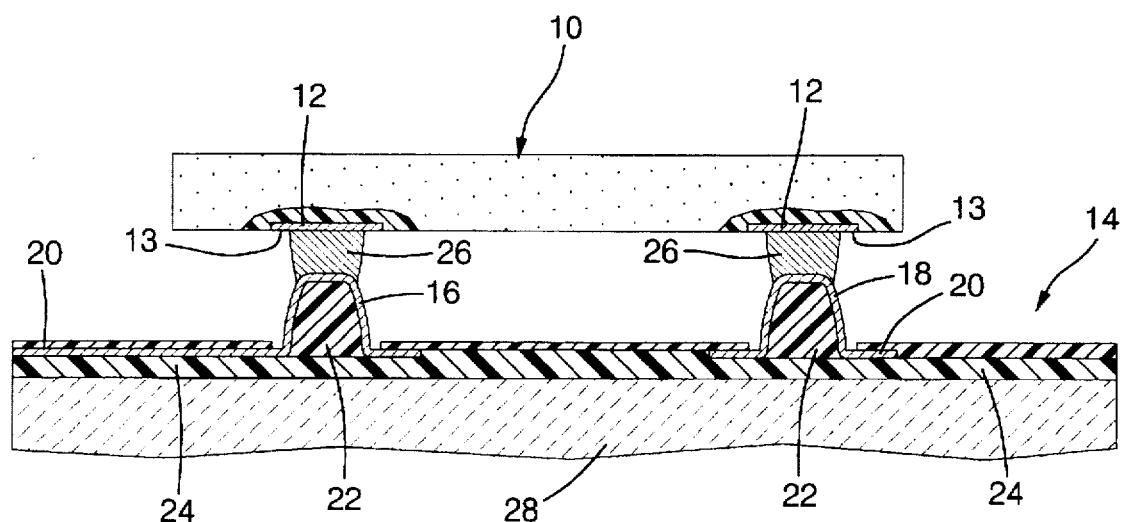

5,790,377

INTEGRAL COPPER COLUMN WITH SOLDER BUMP FLIP CHIP

TECHNICAL FIELD

This invention relates to integrated circuit chips, and more particularly, to structures for supporting the same.

BACKGROUND OF THE INVENTION

Integrated circuit flip chips that are elevated above a substrate having a circuit defined thereon are known to those skilled in the art. Usually the chip is elevated by a solder ball extending between the substrate and the chip. However, shearing of the solder ball has heretofore been problematic. Many have focused on the shape of the "solder ball" to minimize the impact of thermal stresses thereon. Others have tried to elevate the flip chip using a solder ball of one composition encapsulated in a solder column of second composition. However, such structures are extremely difficult to manufacture and place.

Those skilled in the art have noted that a prominent failure mode in flip-chip electronic modules is the fatigue induced by cyclic stressing of solder interconnections. The equation generally employed to obtain a first order of proximation is a modified Manson-equation, which characterizes strain relationship and ultimately results in low cycle fatigue. A modified Manson-Coffin equation is disclosed in Schreiber, "Flipping Chips onto Bumped Flexible Substrates," IPC Printer Circuit Expo, Mar. 3-7, 1996, San Jose, Calif. The equation illustrates that the strain decreases proportionally with roughly the square of the height of the bumps. However, solder bumps tend to form spheres thus limiting the height the flip chip can be increased off the substrate without utilizing substantial surface area on either the substrate or the chip.

The present invention provides alternatives and advantages over the prior art.

SUMMARY OF THE INVENTION

The present invention includes an integral copper column with a solder bump flip chip. An integrated circuit chip is provided having an electrical circuit and including at least two contact pads. A thin layer of barrier metallization is provided over the contact pads. A support substrate is provided having a circuit layer with raised features that include copper traces. A solder bump connects the contact pad on the integrated circuit chip and the raised features of the flex circuit to provide an integral copper column with a solder bump flip chip.

These and other objects, features and advantages of the present invention will become apparent from the following brief description of the drawings, detailed description and appended claims and drawings.

BRIEF DESCRIPTION OF THE DRAWING

The Drawing is a schematic illustration of an integral copper column with solder bump flip chip according to the present invention.

DETAILED DESCRIPTION

As illustrated in the Drawing, the present invention includes an integrated circuit chip 10 having an electric circuit and at least two contact pads 12. Each contact pad includes a thin barrier metallization thereon such as Ti/Cr or nickel 13. A flexible circuit 14 is provided having raised features 16, 18 and traces 20 preferably of metal such as copper. Flexible circuit can be manufactured by any method, but preferably is manufactured using a mandrel as disclosed in U.S. Pat. Nos. 5,207,887 and 5,197,184 to Crumly et al, the disclosures of which are hereby incorporated by reference. A mandrel process will be generally described at the end of this disclosure.

The raised feature 16, 18 if produced by the mandrel process may include a hollow portion which may be unfilled or may be filled with an epoxy 22 or which is simply filled with a polyimide flexible material 24 used to carry the electrical traces 20 of the flex circuit. A solder bump 26 extends between the raised features 16, 18 and the contact pads 12 of the integrated circuit chip. The solder bump may have a variety of compositions but preferably is a 63/37 weight percent Pb/Sn composition. Preferably the solder bump has a height ranging from 4-6 mils to produce a total height of the solder bump and copper column ranging from 6-12 mils high. The present invention may achieve a standoff height greater than the IC pad pitch. Heretofore, solder bumps had been limited to a maximum height of approximately 4 mils. The barrier metallization on the copper pad prevents the solder from physically wicking the metallization on the integrated circuit. The solder balls may be placed directly on the raised feature 16, 18 and the flip chip placed thereon. Alternatively, the flip chip can be manufactured with the solder balls connected thereto and flipped onto the raised feature of the flexible circuit and heated to make the integral copper column with solder bump flip chip device. The flexible circuit can be further supported by a variety substrates 28 including a multi-chip module substrate or a heat sink such as aluminum. The integral copper column with solder bump may be utilized to make electrical contact through the raised feature 16 to the integrated circuit chip and the flexible circuit or the integral copper column with solder bump may be isolated from the circuit on the flex circuit through the raised feature 18 and may be used solely as a heat sink.

The increased height of the flip chip from the substrate due to the integral copper column with solder bump flip chip improves the ability to more easily remove residue and contaminates from under the chip with cleaning agents such as Freon or other hydrofluorocarbons and suitable cleaning agents. When the flux residue is completely cleaned from under the chip, underfill bonding agents such as epoxies wick under the chip better to provide an improved bond between the chip and the substrate.

A suitable method of testing the performance of a flip chip according to the present invention in comparison with other flip chips is disclosed in Schreiber, "Flipping Chips onto Bumped Flexible Substrates," IBC Printer Circuit Expo, Mar. 3-7, 1996, San Jose, Calif., the disclosure of which is hereby incorporated by reference. Testing on a flip-chip test vehicle was conducted for both bumped substrates according to the present invention and nonbumped substrates. Using integrated circuit chips with substantially the same size solder fillets thereon having 60/40 SnPb and 50/50 PbIn bumps were flipped on the flexible circuit substrates having no bumps and flexible circuits having raised features according to the present invention. The circuit was a Daisy chain resistant circuit utilizing a Delco FTB-250 IC. Accelerated thermal shock was conducted on the assembled test vehicle consisting of -40°+150° C. with a minimum dwell of 20 minutes at each excursion. The nonbumped substrates all failed below 100 thermal cycles while several of the bumps assembly exceeded 700 cycles. Resistance was monitored using a Vahala Scientific Digital Ohmmeter Model #4014 during thermal excursion shock. As this example clearly illustrates, multi-fold increases in the life of an interconnection may be obtained by using integral copper column with solder bump flip chip according to the present invention.

A general description of a mandrel process of making a flexible circuit follows.

As illustrated, a stainless steel plate forms a mandrel having a forming surface in which is provided one or a plurality of depressions or dimples, which will define raised features of the resulting circuitry.

The mandrel and its depression or depressions is then coated with a copper coating, typically referred to as flash plated, which covers the entire surface of the mandrel, including the surface of the depressions. The flash plated copper is applied by electroplating or other known techniques and provides a thin conductive coating that prevents the adhesive (that will be used to laminate the circuit substrate) from adhering to the mandrel surface. Flash plating is a conventional electrolytic plating formed in a very short or momentary operation so that only a very thin plating coat is provided. The flash plated coat is very thin compared to the thickness of the electrical circuit traces that are made. For example, for a circuit trace of 1 ½ mil thickness, a flash plating of copper on the mandrel will have a thickness of 0.01 to 0.2 mils. The thin flash plating is employed because it can be relatively easily released from the stainless steel mandrel, and, in addition, may be readily removed from the lamination after separation from the mandrel by a flash etching, which is a very short time or momentary etching process. Obviously, other methods for coating the mandrel with a very thin coat of conductive material that is readily separable from the mandrel and which can be readily removed from the completed circuit traces may be employed in the place of the electrolytic flash plating. Such methods may include sputtering, vapor deposition and electroless plating. If deemed necessary or desirable, the mandrel may be made of a non-electrically conductive material because the thin electrically conductive coating itself enables the additive electroplating of the circuit traces and raised features. The coating, for a dielectric mandrel, can be applied by electroless plating, sputtering, or additional conductive particles in solution. No pattern of non-conductive material, such as Teflon, is permanently affixed to the mandrel. Instead, the flash plated copper is coated with a photoresist, which is then optically exposed through a mask defining a pattern of the desired circuit and developed. The photoresist that has not been polymerized is then removed to leave the partially completed assembly in the configuration illustrated. The flash plated copper coating now bears a pattern of photoresist that is a negative pattern of the circuit trace pattern to be fabricated with this mandrel.

The mandrel assembly is then subjected to a suitable additive electroforming process, such as, for example, electroplating, to plate up copper traces, including trace and a raised feature pad, including a raised feature in the depression. The copper traces are plated directly onto those portions of the flash plated copper coating that are not covered by the negative pattern of developed photoresist. Thus the plating process simultaneously forms both the circuit traces and the raised features. The raised features are partly hollow, having a depression. If deemed necessary or desirable, the depress formed in the electroplated raised feature may be filled with a solid material by placing a dollop of epoxy in the depression and then allowing the epoxy to cure.

The photoresist is then stripped to leave the circuit traces and raised features on the flash plated copper coating which is still on the mandrel. Now a layer of a suitable dielectric and adhesive, such as, for example, a layer of Kapton and an adhesive, are laminated to the mandrel assembly with the traces and circuit features thereon under suitable high temperatures and pressures. This causes the Kapton and adhesive to flow into the spaces between the traces and thereby contact traces and pads on three sides. Only that side of the traces and pads that is directly in contact with the flash plated copper on the mandrel is not contacted by the adhesive substrate.

The assembly now appears including the mandrel, the flash plated copper, traces, pads and features, and the Kapton/adhesive substrate.

The circuit assembly is then removed from the mandrel. Because only the flash plated copper contacts the mandrel, this may be readily separated, and no adhesive of the substrate is in contact with the mandrel. Thus it will be seen that because the mandrel has been initially coated with the protective layer of the flash plated copper, the assembly of dielectric/adhesive substrate and circuit traces and raised features can be readily separated from the mandrel, together with the flash plated copper coating. This separated sub-assembly is shown removed from the mandrel.

Then the flash plated copper coating, which covers the entire lower surface of the assembly is removed by a flash etching process to yield the finished or substantially finished sub-assembly. The sub-assembly is ready for the coverlay lamination, which comprises the standard process for covering at least the side of the sub-assembly bearing the conductive traces with an insulative coverlay.

If deemed necessary or desirable, the removal of the flash plated copper coating may be controlled by a "stop" layer of gold or nickel, which will protect the thicker copper circuit during flash etch removal of the flash plated copper. To this end, the flash coated mandrel with its photolithographically defined resist pattern in place, may be plated with a think layer of gold, about 0.00006 inches thick, upon which the circuitry will be plated. This patterned gold "stop" layer allows the flash plated copper to be removed by the flash etching from the dielectric, but protects the copper circuit.

We claim:

1. An electronic device including a flexible circuit having a plurality of electrical traces thereon, each electrical trace including a raised feature extending above a substantially planar portion of the flexible circuit, and above a substantially planar portion of the remainder of the electrical trace, said electrical traces and raised features comprising copper, an integrated circuit chip having an electrical circuit with a contact pad, a barrier metallization layer over the contact pad and solder extending between the barrier metallization layer and the raised feature to define about integral copper column with solder bump flip chip, and wherein the solder has a height ranging from 4–6 mils, and the raised feature and solder together have a height ranging from 6–12 mils.

2. An electronic device as set forth in claim 1 wherein said raised feature and solder have a height together ranging from about 6–12 mils high.

3. An electronic device as set forth in claim 2 wherein said solder has a height ranging from about 4–6 mils.

4. An electronic device as set forth in claim 1 wherein the integrated circuit chip includes an electrical circuit connected to the contact pad and wherein said raised feature and solder provide an electrical connection between the integrated circuit chip in a circuit defined on the flex circuit.

5. An electronic device as set forth in claim 1 wherein the raised feature and solder are isolated from the circuit on the flip chip and provide a heat sink path for dissipating heat from the integrated circuit chip.

6. An electronic device as set forth in claim 1 further comprising a multi-chip module underlying said flex circuit and electrically connected thereto.

7. An electronic device as set forth in claim 5 further comprising a second raised feature of said flexible circuit electrically connected to said integrated circuit chip.

* * * * *